US011854815B2

(12) United States Patent
Kawabuchi

(10) Patent No.: US 11,854,815 B2
(45) Date of Patent: Dec. 26, 2023

(54) SUBSTRATE DRYING APPARATUS, SUBSTRATE DRYING METHOD AND STORAGE MEDIUM

(71) Applicant: TOKYO ELECTRON LIMITED, Tokyo (JP)

(72) Inventor: Yosuke Kawabuchi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 765 days.

(21) Appl. No.: 16/962,742

(22) PCT Filed: Jan. 28, 2019

(86) PCT No.: PCT/JP2019/002630
§ 371 (c)(1),
(2) Date: Jul. 16, 2020

(87) PCT Pub. No.: WO2019/146776
PCT Pub. Date: Aug. 1, 2019

(65) Prior Publication Data
US 2020/0357649 A1    Nov. 12, 2020

(30) Foreign Application Priority Data

Jan. 29, 2018  (JP) .................................. 2018-012932

(51) Int. Cl.
*H01L 21/304*  (2006.01)
*F26B 3/24*  (2006.01)
*F26B 21/10*  (2006.01)

(52) U.S. Cl.
CPC .............. *H01L 21/304* (2013.01); *F26B 3/24* (2013.01); *F26B 21/10* (2013.01)

(58) Field of Classification Search
CPC ........... H01L 21/304; F26B 3/24; F26B 21/10
See application file for complete search history.

(56) References Cited

U.S. PATENT DOCUMENTS 3,148,084 A * 9/1964 Chamberlin ...... H01L 21/02557
257/E31.026
3,481,778 A * 12/1969 Neugebauer ............ C23C 14/56
428/662

(Continued)

FOREIGN PATENT DOCUMENTS

CN        107481954 A    12/2017
JP        2012-243869 A  12/2012

(Continued)

*Primary Examiner* — David J Laux
*Assistant Examiner* — Bao D Nguyen
(74) *Attorney, Agent, or Firm* — Nath, Goldberg & Meyer; Jerald L. Meyer; Tanya E. Harkins

(57) ABSTRACT

A substrate drying apparatus, a substrate drying method and a storage medium are capable of sublimating a sublimable substance filled in recesses of a pattern formed on a substrate while preventing pattern collapse. A first unit includes a solution supplier which supplies a sublimable substance solution containing a sublimable substance and a solvent to a processing surface, and a first liquid remover which forms a solid film of the sublimable substance on the processing surface by removing the solvent and a processing liquid from the processing surface. A second unit includes a second liquid remover which vaporize the solvent and the processing liquid remaining in the solid film by heating the substrate, and maintaining the substrate at a temperature within a first temperature range, and a solid film remover which remove the solid film from the processing surface by heating the substrate at a temperature within a second temperature range.

15 Claims, 9 Drawing Sheets

(56) References Cited

U.S. PATENT DOCUMENTS

| | | | | |
|---|---|---|---|---|
| 6,037,001 A | * | 3/2000 | Kaloyeros | H01L 21/76877 427/124 |
| 2003/0170407 A1 | * | 9/2003 | Okuyama | C23C 14/5873 428/34.1 |
| 2005/0084611 A1 | * | 4/2005 | Okuyama | C23C 14/024 427/372.2 |
| 2013/0160712 A1 | * | 6/2013 | Niboshi | C23C 14/26 118/726 |
| 2016/0204009 A1 | * | 7/2016 | Nguyen | H01L 21/67109 165/80.4 |
| 2017/0040154 A1 | * | 2/2017 | Kagawa | H05K 999/99 |
| 2017/0278726 A1 | * | 9/2017 | Miya | H01L 21/67028 |
| 2019/0063833 A1 | * | 2/2019 | Okutani | F26B 5/04 |
| 2019/0063834 A1 | * | 2/2019 | Okutani | H01L 21/02052 |
| 2019/0228963 A1 | * | 7/2019 | Nakamori | H01L 21/67051 |

FOREIGN PATENT DOCUMENTS

| | | | |
|---|---|---|---|
| JP | 2012243869 A | * | 12/2012 |
| JP | 2015-106645 A | | 6/2015 |

* cited by examiner

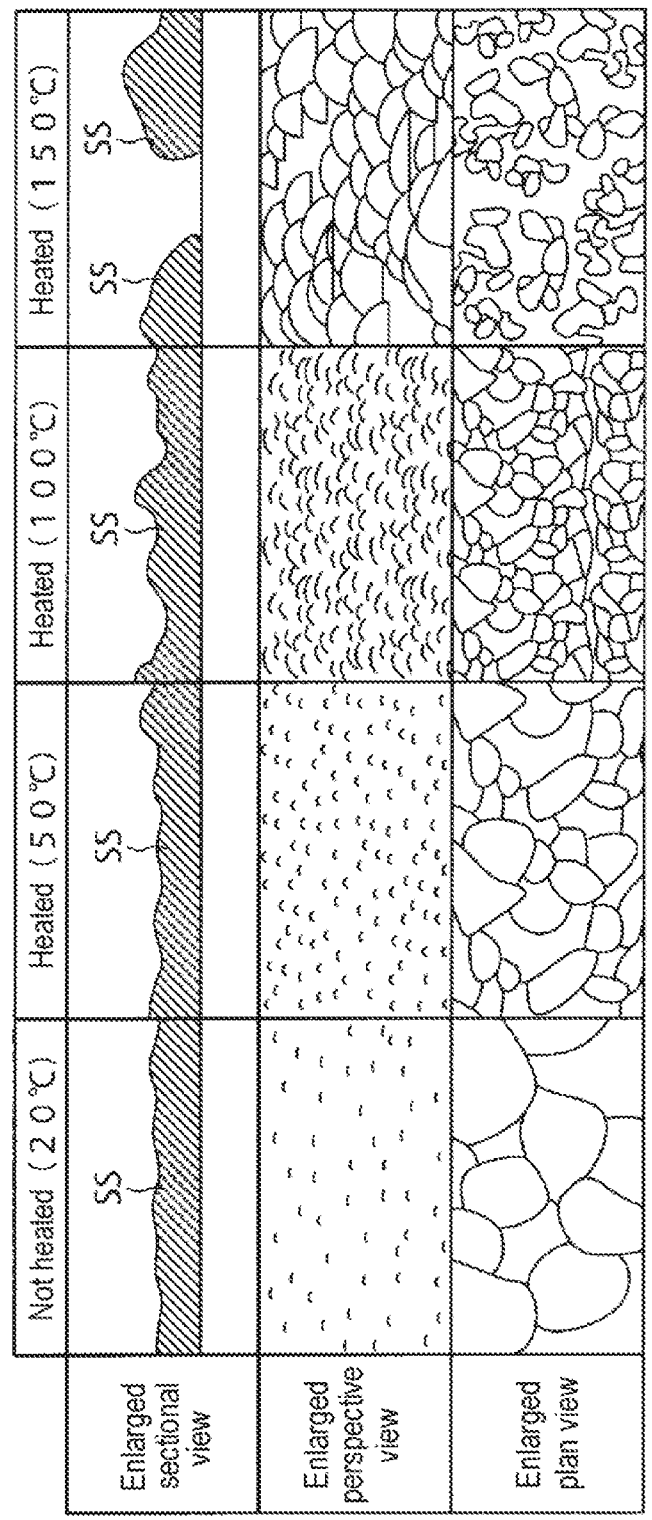

SUBSTRATE DRYING APPARATUS, SUBSTRATE DRYING METHOD AND STORAGE MEDIUM

This is a National Phase Application filed under 35 U.S.C. 371 as a national stage of PCT/JP2019/002630, filed Jan. 28, 2019, an application claiming the benefit of Japanese Application No. 2018-012932, filed Jan. 29, 2018, the content of each of which is hereby incorporated by reference in its entirety.

TECHNICAL FIELD

The present disclosure relates to a technique for drying a substrate by sublimating a sublimable substance filled in a recess of a pattern formed on the substrate.

BACKGROUND

In recent years, a pattern formed on a substrate such as a semiconductor wafer or the like has been miniaturized, and the aspect ratio (height/width ratio) of the pattern has been increased. As the pattern becomes finer and the aspect ratio becomes higher, pattern collapse (the collapse of convex portions forming the pattern) due to the surface tension of a liquid in the pattern recess is more likely to occur in a drying process of a substrate after a liquid treatment. In order to deal with this problem, a drying process using a sublimable substance may be performed (see, e.g., Patent Document 1), In this drying process, a step of substituting a liquid such as IPA or the like existing in the pattern recess with a sublimable substance solution, a step of filling the pattern recess with a sublimable substance solidified by evaporating a solvent contained in the sublimable substance solution, and a step of sublimating the solidified sublimable substance are sequentially performed. According to the drying process using such a sublimable substance, it is possible to prevent the pattern collapse caused by the surface tension of the liquid.

However, pattern collapse may be caused even in the drying process using such a sublimable substance.

PRIOR ART DOCUMENTS

Patent Documents

Patent Document 1: Japanese laid-open publication No. 2012-243869

The present disclosure provides some embodiments of a technique capable of sublimating a sublimable substance filled in recesses of a pattern formed on a substrate while preventing pattern collapse.

SUMMARY

According to one embodiment of the present disclosure, there is provided a substrate drying apparatus for drying a substrate having a processing surface that has been subjected to a liquid processing using a processing liquid, including: a first unit configured to form a solid film of a sublimable substance on the processing surface; and a second unit configured to remove the solid film from the processing surface by sublimating the solid film, wherein the first unit includes: a solution supplier configured to supply a sublimable substance solution containing the sublimable substance and a solvent to the processing surface; and a first liquid remover configured to remove the solvent and the processing liquid from the processing surface supplied with the sublimable substance solution and to form the solid film of the sublimable substance on the processing surface, and the second unit includes: a second liquid remover configured to vaporize the solvent and the processing liquid remaining in the solid film by heating the substrate, on which the solid film is formed, and maintaining the substrate at a temperature falling within a first temperature range that is lower than a sublimation temperature of the sublimable substance; and a solid film remover configured to remove the solid film from the processing surface by heating the substrate to a temperature falling within a second temperature range that is equal to or higher than the sublimation temperature of the sublimable substance after the second liquid remover maintains the substrate at the temperature falling within the first temperature range.

According to another embodiment of the present disclosure, there is provided a substrate drying method for drying a substrate having a processing surface that has been subjected to a liquid processing using a processing liquid, including: a first processing step of forming a solid film of a sublimable substance on the processing surface; and a second processing step of removing the solid film from the processing surface by sublimating the solid film, wherein the first processing step includes: supplying a sublimable substance solution containing the sublimable substance and a solvent to the processing surface; and removing the solvent and the processing liquid from the processing surface supplied with the sublimable substance solution and forming the solid film of the sublimable substance on the processing surface, and wherein the second processing step includes: vaporizing the solvent and the processing liquid remaining in the solid film by heating the substrate, on which the solid film is formed, and maintaining the substrate at a temperature falling within a first temperature range that is lower than a sublimation temperature of the sublimable substance; and removing the solid film from the processing surface by heating the substrate to a temperature falling within a second temperature range that is equal to or higher than the sublimation temperature of the sublimable substance after the substrate is maintained at the temperature falling within the first temperature range.

According to a further embodiment of the present disclosure, there is provided a storage medium storing a program that, when executed by a computer for controlling an operation of a substrate drying apparatus, causes the computer to control the substrate drying apparatus to perform the aforementioned substrate drying method.

According to the present disclosure, it is possible to sublimate a sublimable substance filled in recesses of a pattern formed on a substrate while preventing pattern collapse.

BRIEF DESCRIPTION OF DRAWINGS

FIG. 5 shows an enlarged sectional view, an enlarged perspective view and an enlarged plan view showing state images of a sublimable substance film depending on a heating temperature.

DETAILED DESCRIPTION

Figure 1:
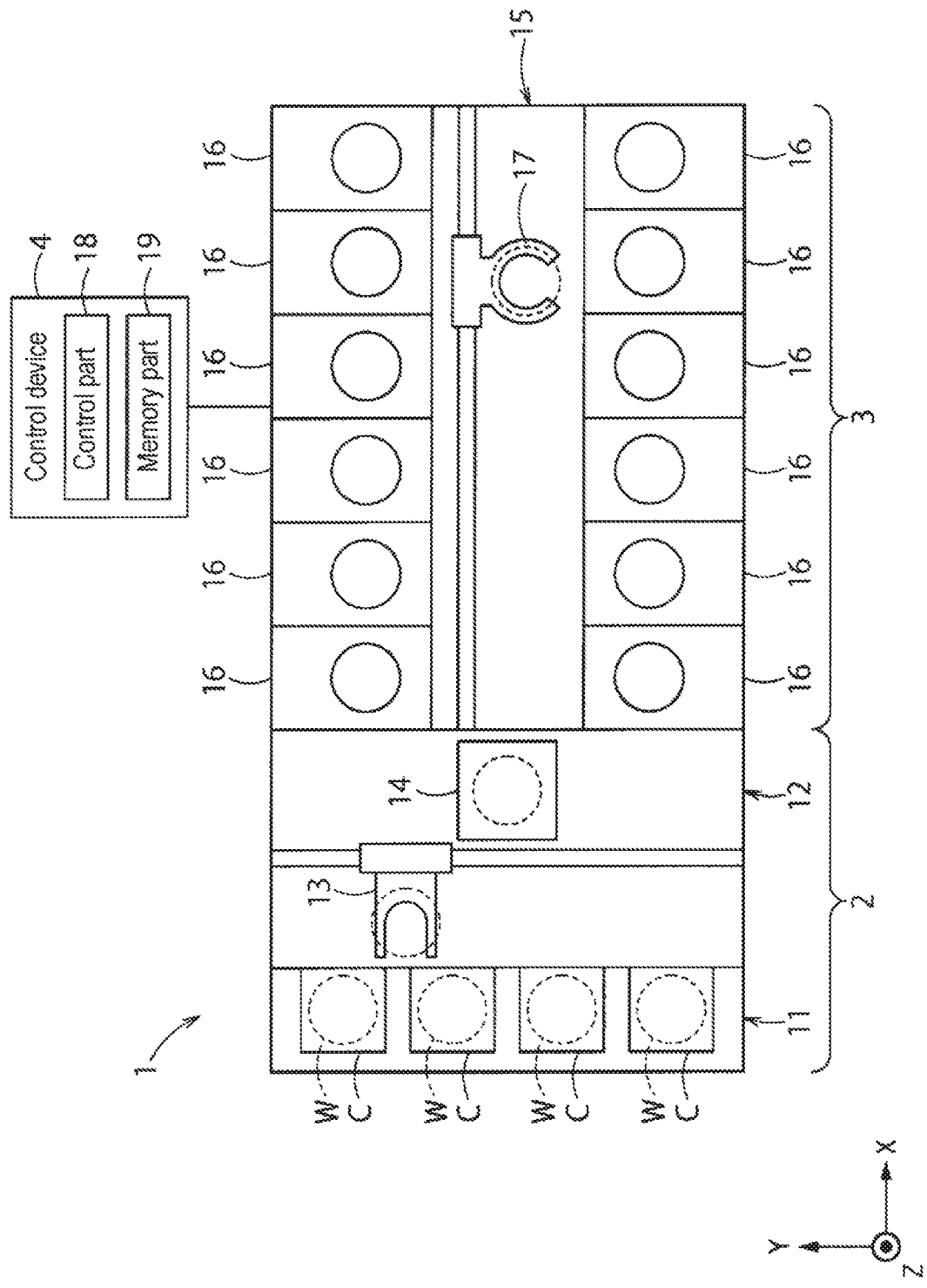
FIG. 1 is a view showing a schematic configuration of a substrate processing system.

FIG. 1 is a view showing a schematic configuration of a substrate processing system according to the present embodiment. In the following description, an X axis, a Y axis and a Z axis which are orthogonal to each other are defined in order to clarify positional relationships. The positive direction of the Z axis is defined as a vertically upward direction.

As shown in FIG. 1, a substrate processing system 1 includes a loading/unloading station 2 and a processing station 3. The loading/unloading station 2 and the processing station 3 are installed adjacent to each other.

The loading/unloading station 2 includes a carrier mounting part 11 and a transfer part 12. A plurality of carriers C for accommodating a plurality of waters W in a horizontal state are mounted on the carrier mounting part 11.

The transfer part 12 is installed adjacent to the carrier mounting part 11, and includes a substrate transfer device 13 and a delivery part 14 arranged therein. The substrate transfer device 13 includes a substrate holding mechanism that holds the wafer W. The substrate transfer device 13 is capable of moving in a horizontal direction and a vertical direction and rotating about a vertical axis, and transfers the wafer W between the carrier C and the delivery part 14 by using the substrate holding mechanism.

The processing station 3 is installed adjacent to transfer part 12. The processing station 3 includes a transfer part 15 and a plurality of processing units 16. The processing units 16 are arranged side by side on both sides of the transfer part 15.

The transfer part 15 includes a substrate transfer device 17 arranged therein. The substrate transfer device 17 includes a substrate holding mechanism that holds the wafer W. Furthermore, the substrate transfer device 17 is capable of moving in a horizontal direction and a vertical direction and rotating about a vertical axis, and transfers the wafer W between the delivery part 14 and the processing unit 16 by using the substrate holding mechanism.

The processing unit 16 performs a predetermined substrate processing process on the wafer W transferred by the substrate transfer device 17.

The substrate processing system 1 further includes a control device 4. The control device 4 is, for example, a computer, and includes a control part 18 and a memory part 19. The memory part 19 stores a program for controlling various processes executed in the substrate processing system 1. The control part 18 controls the operation of the substrate processing system 1 by reading and executing the program stored in the memory part 19.

The program may be recorded in a computer-readable storage medium, and may be installed in the memory part 19 of the control device 4 from the storage medium. Examples of the computer-readable storage medium includes a hard disk (HD), a flexible disk (FD), a compact disk (CD), a magneto-optical disk (MO), a memory card, and the like.

In the substrate processing system 1 configured as described above, first, the substrate transfer device 13 of the loading/unloading station 2 takes out the wafer W from the carrier C mounted on the carrier mounting part 11 and places the taken-out wafer W on the delivery part 14. The wafer W placed on the delivery part 14 is taken out from the delivery part 14 by the substrate transfer device 17 of the processing station 3 and loaded into the processing unit 16.

The wafer W loaded into the processing unit 16 is processed by the processing unit 16. Thereafter, the wafer W is unloaded from the processing unit 16 by the substrate transfer device 17, and placed on the delivery part 14. Then, the processed wafer W placed on the delivery part 14 is returned to the carrier C of the carrier mounting part 11 by the substrate transfer device 13.

Next, the configuration of the processing unit 16 will be described. The processing unit 16 included in the substrate processing system 1 shown in FIG. 1 includes a cleaning unit 16A and a baking unit 16B. Although the cleaning unit 16A and the baking unit 16B are not illustrated separately in FIG. 1, for example, the processing unit 16 on the upper side of the processing station 3 in FIG. 1 may be used as the cleaning unit 16A, and the processing unit 16 on the lower side of the processing station 3 in FIG. 1 may be used as the baking unit 16B.

Figure 2:
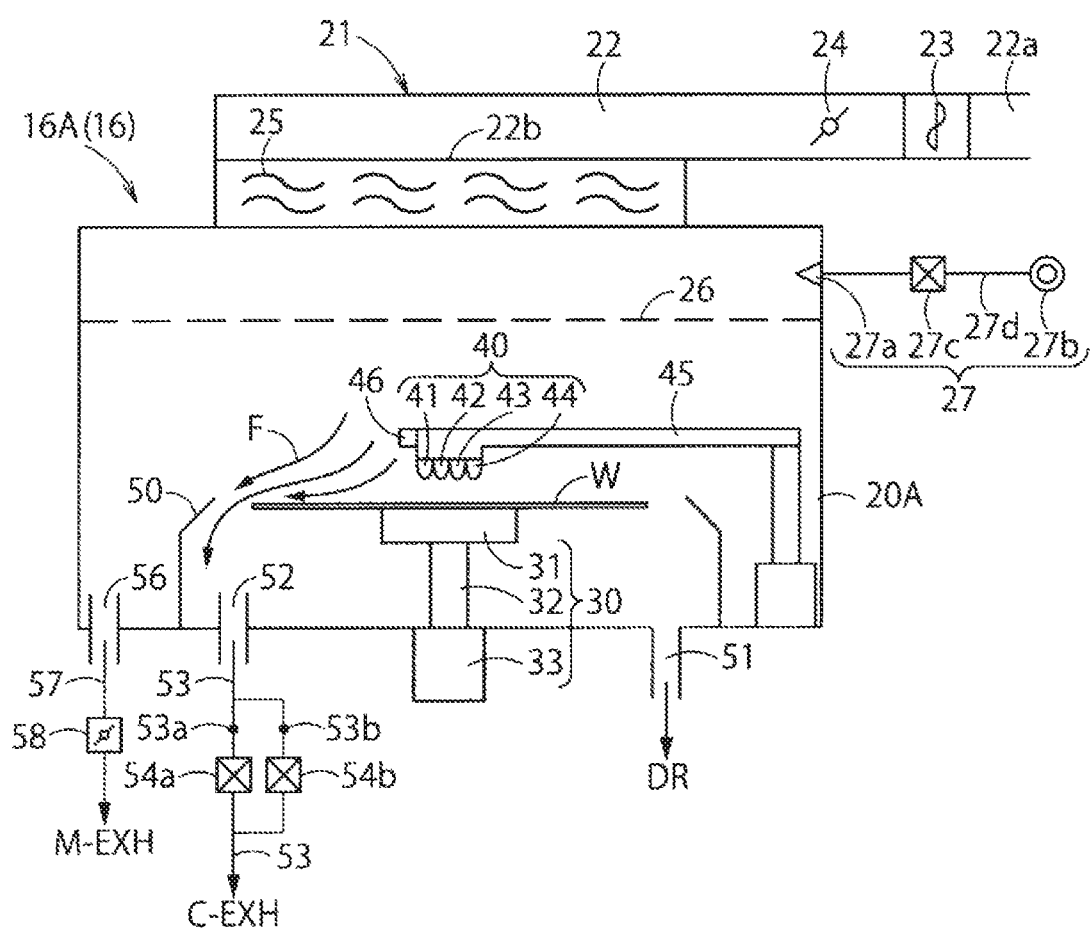
FIG. 2 is a view showing a schematic configuration of a cleaning unit.

As shown in FIG. 2, the cleaning unit 16A includes a chamber (unit housing) 20A. A substrate holding mechanism 30 is installed in the chamber 20A. The substrate holding mechanism 30 includes a holding part 31, a support column part 32, and a driving part 33. The substrate holding mechanism 30 rotates the support column part 32 through the use of the driving part 33 to rotate the holding part 31 supported by the support column part 32, thereby rotating the wafer W held by the holding part 31.

A processing liquid is supplied from a processing liquid supplier 40 to the wafer W held by the substrate holding mechanism 30. The processing liquid supplier 40 includes a chemical liquid nozzle 41 for supplying a chemical liquid (e.g., DHF, SC-1, etc.), a rinsing nozzle 42 for supplying a rinsing liquid (e.g., pure water (DIW)), a solvent nozzle 43 for supplying a solvent (e.g., isopropyl alcohol (IPA)) capable of dissolving a sublimable substance, and a sublimable substance solution nozzle 44 for supplying a sublimable substance solution (e.g. a solution obtained by dissolving ammonium silicofluoride in a solvent (e.g., IPA)).

The above nozzles 41 to 44 are connected to corresponding processing liquid supply sources (liquid storage tanks or factory powers) (not shown) via corresponding supply lines (not shown). Flow rate adjustment devices (not shown) such as an opening/closing valve and a flow rate control valve are installed in each supply line. The nozzles 41 to 44 are attached to the tip of a nozzle arm 45. By operating the nozzle arm 45, the nozzles 41 to 44 can be moved between a processing position directly above the central portion of the wafer W and a standby position which is an outer portion of the wafer W.

An FFU (Fan Filter Unit) 21 is installed on the ceiling of the chamber 20A. A fan 23 and a flow control valve such as a damper 24 or the like are installed in a duct 22 of the FFU 21. By rotating the fan 23, the air in a clean room flows into the duct 22 through a suction port 22a of the duct 22. The air is filtered by a filter such as a ULPA filter 25 or the like installed below an outlet 22b of the duct 22 and then flows downward into the internal space of the chamber 20A.

The FFU 21 and a gas supplier 27 are installed as a gas supply mechanism that supplies a gas into the chamber 20A. A baffle plate 26 in the form of a punching plate is installed in an upper portion of the chamber 20A. The baffle plate 26 adjusts the distribution of the clean air discharged downward from the FFU 21 into the chamber 20A. The gas supplier 27 supplies a gas to the space between the FFU 21 and the baffle plate 26. The gas supplier 27 includes a gas supply nozzle 27a. A clean low-humidity gas such as a nitrogen gas or a dry air is supplied to the gas supply nozzle 27a from a gas supply source 27b through a gas supply line 27d on which a flow rate adjustment device 27c such as an opening/closing valve or a flow rate control valve is installed. The gas supplier 27 may be installed so as to supply a gas into the duct 22 of the FFU 21 (to a downstream of the damper 24). The FFU 21 and the gas supplier 27 are examples of a gas supply mechanism. The installation position, shape, gas supply amount, etc. of the gas supply mechanism may vary depending on the apparatus structure.

A collection cup 50 is arranged so as to surround the holding part 31 of the substrate holding mechanism 30. The collection cup 50 collects the processing liquid scattered from the wafer W. A drain port 51 is formed at the bottom of the collection cup 50. The processing liquid collected by the collection cup 50 is discharged to the outside of the processing unit 16 through the drain port 5 (described as "DR" in FIG. 2). Furthermore, an exhaust port 52 for discharging the atmosphere inside the collection cup 50 to the outside of the processing unit 16 is formed at the bottom of the collection cup 50. The exhaust through the exhaust port 52 is described as "cup exhaust (C-EXH)".

As an exhaust mechanism for exhausting the atmosphere inside the chamber 20A, an exhaust path 53 is connected to the exhaust port 52. The atmosphere inside the collection cup 50 is constantly sucked through the exhaust path 53 and the exhaust port 52, and the inside of the collection cup 50 is under a negative pressure. Therefore, the clean air that is supplied from the FFU 21, flows downward through the baffle plate 26, and then reaches the space above the wafer W and in the vicinity of the wafer W (hereinafter referred to as "wafer upper vicinity space" for the sake of simplicity) is drawn into the collection cup 50 through the space between the peripheral wall of the upper opening of the collection cup 50 and the outer peripheral edge of the wafer W (see arrow F in FIG. 2). Due to the above air flow, the atmosphere (chemical liquid atmosphere or solvent atmosphere) derived from the processing liquid supplied to the wafer W is restrained from staying in the wafer upper vicinity space.

The exhaust path 53 is branched into two branch paths 53a and 53b that join again into one exhaust path 53. The downstream end of the exhaust path 53 is connected to a depressurized duct of a factory exhaust system (not shown). A normally-opened opening/closing valve 54a is installed in one branch path 53a, and a normally-closed opening/closing valve 54b is installed in the other branch path 53b. By opening the opening/closing valve 54b, the flow rate of the exhaust gas (cup exhaust gas) flowing through the exhaust path 53 increases, and the pressure in the collection cup 50 decreases. As a result, the flow rate of the gas drawn into the collection cup 50 increases. This makes it possible to increase the flow rate (or flow velocity) of the gas (clean air) flowing in the wafer upper vicinity space.

Instead of providing the two branch paths 53a and 53b, a flow rate adjustment valve such as a damper or a butterfly valve may be installed in the single exhaust path 53, and the opening degree of the flow rate adjustment valve may be adjusted to adjust the flow rate of the exhaust gas flowing through the exhaust path 53. Even in this case, it is possible to change the flow rate (or flow velocity) of the gas (clean air) flowing in the wafer upper vicinity space. In the configuration of FIG. 2, a flow rate adjustment valve may be installed in the exhaust path 53 upstream or downstream of the branch paths 53a and 53b. The structure of the exhaust path 53 is not limited to the above example. The installation position, shape, gas supply amount, and the like of the exhaust mechanism may vary depending on the apparatus structure.

A solvent concentration sensor 46 is attached to the tip of the nozzle arm 45. The solvent concentration sensor 46 may measure the solvent concentration (IPA concentration) in the wafer upper vicinity space.

The collection cup 50 may be configured by combining a plurality of cup bodies (not shown), and different fluid paths may be formed in the collection cup 50 by changing the relative positional relationship of the cup bodies. In this case, the processing liquid and the gas accompanying the processing liquid are discharged from the collection cup 50 through the fluid passage corresponding to the type of the processing liquid (e.g., an acidic processing liquid, an alkaline processing liquid or an organic processing liquid). Since such a configuration is well known to those skilled in the art, the illustration and description thereof will be omitted. In this case, it is only necessary that the exhaust flow rate is adjustable as described above, at least when performing a process using an organic processing liquid (e.g., a solvent, a sublimable substance solution, etc.).

An exhaust port 56 for exhausting the atmosphere outside the collection cup 50 is installed outside the collection cup 50 at the bottom of the chamber 20A. An exhaust path 57 connected to a duct of a factory exhaust system (not shown) is connected to the exhaust port 56. A flow rate adjustment valve 58 such as a damper or a butterfly valve is installed in the exhaust path 57. By discharging the atmosphere in the internal space of the chamber 20A through the exhaust port 56, it is possible to prevent a chemical liquid atmosphere or an organic atmosphere from staying outside the collection cup 50. The exhaust through the exhaust port 56 is described as "module exhaust (M-EXH)".

Next, the baking unit 16B will be briefly described with reference to FIG. 3. The baking unit 16B includes a chamber 20B. Inside the chamber 20B, there are installed a heating plate 61 having a resistance heater 62 built therein and a plurality of support pins 63 installed so as to protrude from the upper surface of the heating plate 61. The support pins 63 are configured to support the peripheral portion and the central portion of the lower surface of the wafer W. A gap is formed between the lower surface of the wafer W and the upper surface of the heating plate 61. The support pins 63 are installed so as to be capable of advancing and retreating in the height direction (i.e., the Z direction in FIG. 1) under the control of the control device 4 as will be described later. The support pins 63 are capable of changing the size of the gap between the lower surface of the wafer W and the upper surface of the heating plate 61. Above the heating plate 61, there is installed an exhaust hood (cover) 64 capable of moving up and down. An exhaust pipe 65, on which a sublimable substance collection device 66 and a pump 67 are installed, is connected to an opening formed at the center of the exhaust hood 64. The sublimable substance collection device 66 collects a sublimable substance by cooling the exhaust gas flowing into the sublimable substance collection device 66 through the exhaust pipe 65 and precipitating the sublimable substance.

Next, a series of processes executed by the above-described substrate processing system 1 including the cleaning unit 16A and the baking unit 16B will be described. The following series of processes are automatically executed under the control of the control device 4 (see FIG. 1).

A wafer W, which has been dry-etched to give a pattern to a film (e.g., a SiN film) constituting a semiconductor device, is loaded into the cleaning unit 16A by the substrate transfer device 17 and horizontally held by the substrate holding mechanism 30.

First, the chemical liquid nozzle 41 is positioned above the central portion of the wafer W rotated by the substrate holding mechanism 30, and a chemical liquid for cleaning is supplied to the wafer W from the chemical liquid nozzle 41, whereby unnecessary substances such as etching residues and particles generated in the previous step are removed from the surface of the wafer W (chemical liquid cleaning step).

Next, while continuing to rotate the wafer W, the rinsing nozzle 42 is positioned above the central portion of the wafer W, and a rinsing liquid (e.g., DIW) is supplied from the rinsing nozzle 42 to the wafer W, whereby the chemical liquid and the reaction product generated in the previous step on the wafer W are removed (rinsing step).

Figure 4A:
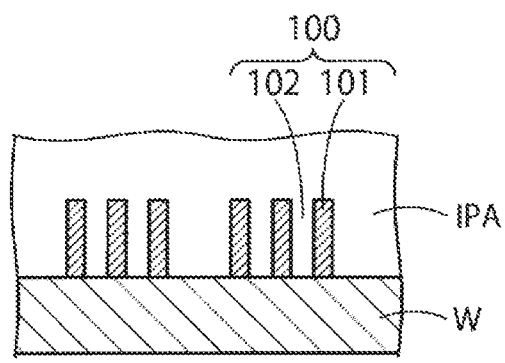
FIG. 4A is a schematic sectional view of a wafer surface portion for explaining a step performed in the cleaning unit.

Next, while continuing to rotate the wafer W, the solvent nozzle 43 is positioned above the central portion of the wafer W, and IPA (containing no sublimable substance) (i.e., a solvent capable of dissolving the sublimable substance) is supplied from the solvent nozzle 43 to the wafer W, whereby the DIW on the wafer W is replaced with the IPA (solvent supply step). The state at this time is illustrated in FIG. 4A. That is, the entire pattern 100 (having protrusions 101 and recesses 102 between the adjacent protrusions 101) formed on the surface of the wafer W is covered with the liquid film of IPA.

Figure 4B:
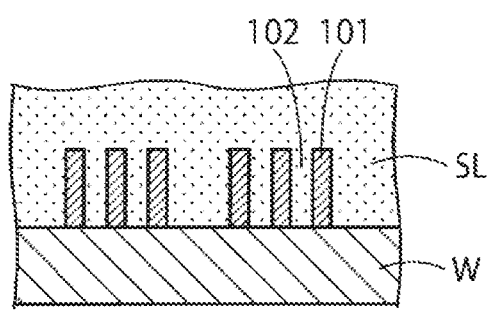
FIG. 4B is a schematic sectional view of the wafer surface portion for explaining a step performed in the cleaning unit.

Next, while continuously rotating the wafer W, the sublimable substance solution nozzle 44 is positioned above the central portion of the wafer W, and a sublimable substance solution SL (i.e., a solution obtained by dissolving a sublimable substance in IPA which is a solvent capable of dissolving the sublimable substance) is supplied to the wafer W, whereby the IPA on the wafer W is replaced with the sublimable substance solution SL (sublimable substance solution supply step). The state at this time is illustrated in FIG. 4B. That is, the recesses 102 are filled with the sublimable substance solution SL, and the entire pattern 100 formed on the surface of the wafer W is covered with a liquid film of the sublimable substance solution SL. Thereafter, by adjusting the rotation of the wafer W, the thickness of the liquid film of the sublimable substance solution SL (which determines the film thickness "t" of the sublimable substance film SS) is adjusted.

Figure 4C:
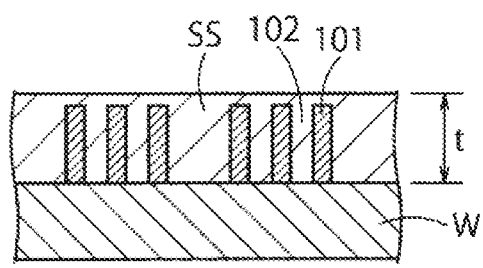
FIG. 4C is a schematic sectional view of the wafer surface portion for explaining a step performed in the cleaning unit.

Next, the solvent in the sublimable substance solution is evaporated to precipitate (solidify) the sublimable substance, thereby forming a solid sublimable substance film SS (precipitation step). The precipitation step may be performed by, for example, a spin dry process in which the solvent is naturally evaporated while rotating wafer W (without supplying a liquid to the wafer W). The precipitation step may be promoted by warming the wafer W by a heating means (e.g., a resistance heater or an LED heating lamp) (not shown) which is built in the holding part 31 of the substrate holding mechanism 30 or arranged near the wafer W. The state at the end of the precipitation step is illustrated in FIG. 4C, That is, the recesses 102 are filled with the solid sublimable substance film SS. The film thickness "t" of the sublimable substance film SS is a value at which the pattern 100 is not exposed (i.e., "t" is larger than the height "h" of the protrusions 101 of the pattern 100). The film thickness "t" of the sublimable substance film SS is preferably set as small as possible.

In order to prevent the pattern 100 from being exposed to the ambient atmosphere due to liquid breakage between the chemical liquid cleaning step and the rinsing step, between the rinsing step and the solvent supply step, and between the solvent supply step and the sublimable substance solution supply step, it is preferable that the end of the discharge period of the processing liquid used in the previous step and the start of the discharge period of the processing liquid used in the subsequent process overlap with each other.

While performing the chemical liquid cleaning step, the rinsing step, the solvent supply step, the sublimable substance solution supply step and the precipitation step described above, the solvent (IPA) concentration in the wafer upper vicinity space is measured by the solvent concentration sensor 46 attached to the tip portion of the nozzle arm 45. When the measured value of the solvent concentration exceeds a predetermined threshold value (first threshold value), for example, 500 ppm, the control device 4 increases the flow rate of the exhaust passing through the exhaust path 53. The increase in the flow rate of the exhaust can be implemented by opening the normally-closed opening/closing valve 54b.

By increasing the flow rate of the exhaust in the exhaust path 53, as described above, the flow rate of the gas drawn into the collection cup 50 from the wafer upper vicinity space increases, and the flow rate (or flow velocity) of the gas flowing in the wafer upper vicinity space increases. Thus, the solvent vapor (IPA vapor) drifting in the wafer upper vicinity space is more strongly drawn into the collection cup 50. As a result, it is possible to reduce the solvent concentration (IPA concentration) in the wafer upper vicinity space.

The increased flow rate of the exhaust in the exhaust path 53 may be maintained until the precipitation step is completed. By doing so, it is possible to more reliably maintain the solvent concentration in the wafer upper vicinity space at a low level. Alternatively, when the IPA concentration detected by the solvent concentration sensor 46 becomes less than a predetermined threshold value (second threshold value), the increased flow rate of the exhaust in the exhaust path 53 may be returned to the original value. By doing so, it is possible to effectively use the factory power (factory exhaust system). The first threshold value and the second threshold value may be the same value. However, from the viewpoint of control stability, it is preferable to set the second threshold value smaller than the first threshold value.

If the flow rate of the exhaust in the exhaust path 53 (the flow rate of the exhaust of the cup exhaust) is increased, the pressure inside the chamber 20A may decrease, and the atmosphere outside the chamber 20A may flow into the chamber 20A, in order to solve this problem, it is possible to execute at least one of countermeasures such as: (1) reducing the flow rate of the exhaust in the exhaust path 57 (the flow rate of the exhaust of the module exhaust); (2) supplying the gas from the gas supply nozzle 27a of the gas supplier 27 to increase the total flow rate of the gas supplied into the chamber 20A; and (3) increasing the total flow rate of the gas supplied from the FFU 21 into the chamber 20A (for example, by controlling the fan 23 or the damper 24), if the FFU 21 can individually control the flow rate of the gas supplied to each chamber 20A. When the countermeasure (2) or (3) that increases the flow rate of the gas supplied into the chamber 20A is adopted, the down-flow of the gas flowing into the wafer upper vicinity space increases. Therefore, it is possible to more efficiently reduce the solvent concentration in the wafer upper vicinity space.

After the precipitation step is completed, the substrate transfer device 17 unloads the wafer W from the cleaning unit 16A and loads the wafer W into the baking unit 16B. Then, the exhaust hood 64 descends to cover the upper side of the wafer W. While the pump 67 installed in the exhaust pipe 65 connected to the exhaust hood 64 sucks the space above the wafer V, the wafer W is heated by the heated heating plate 61 to a temperature equal to or higher than the sublimation temperature of the sublimable substance. As a result, the sublimable substance on the water W is sublimated and removed from the wafer W (sublimable substance removal step).

Figure 4D:
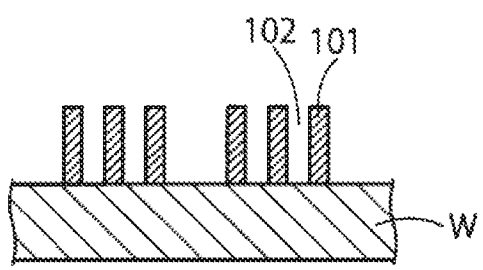
FIG. 4D is a schematic sectional view of the wafer surface portion for explaining a step performed in the cleaning unit.

The state at the end of the sublimable substance removal step is illustrated in FIG. 4D. After the sublimable substance removal step is completed, the wafer W is unloaded from the baking unit 16B by the substrate transfer device 17 and transferred to the original carrier C.

Next, an apparatus and a method for appropriately sublimating the sublimable substance film SS while preventing the pattern 100 from being collapsed due to the residual liquid contained in the sublimable substance film SS on the wafer W will be described.

FIG. 5 shows an enlarged sectional view, an enlarged perspective view and an enlarged plan view showing state images of the sublimable substance film SS depending on the heating temperature. Specifically, in FIG. 5, a state in which the sublimable substance film SS is not heated (a state in which the sublimable substance film SS is placed in an environment of approximately 20 degrees C.), a state in which the sublimable substance film SS is heated to 50 degrees C., a state in which the sublimable substance film SS is heated to 100 degrees C. and a state in which the sublimable substance film SS is heated to 150 degrees C. are shown by an enlarged sectional view, an enlarged perspective view and an enlarged plan view of the sublimable substance film SS, respectively. Each view shown in FIG. 5 is based on an image taken by a SEM (scanning electron microscope) for a sublimable substance film SS containing ammonium silicofluoride as a sublimable substance, and is depicted in a simplified manner for easy understanding.

Since the sublimation temperature of ammonium silicofluoride at the atmospheric pressure is sufficiently higher than 150 degrees C., it has been considered that the sublimation phenomenon of solid ammonium silicofluoride hardly occurs at a temperature of 150 degrees C. or lower. However, it was newly found by the present inventor that, as is apparent from FIG. 5, in reality, even if the temperature is lower than the sublimation temperature, the solid ammonium silicofluoride (i.e., the sublimable substance film SS) slightly disappears.

Since the sublimable substance film SS disappears at a temperature lower than the sublimation temperature in reality, even in the drying process of the wafer W using the sublimable substance, the collapse of the pattern 100 may be induced by the surface tension of water or a solvent such as IPA or the like remaining in the sublimable substance film SS.

Figure 6A:
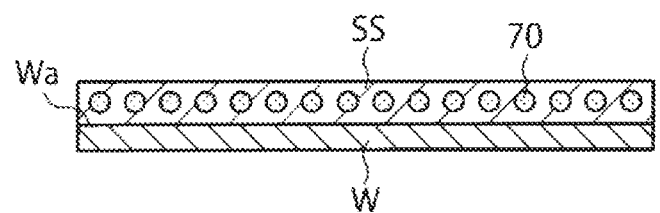
FIG. 6A is a conceptual diagram for explaining a state of a liquid remaining in a sublimable substance film formed on a processing surface of a wafer state before heating the sublimable substance film).
Figure 6B:
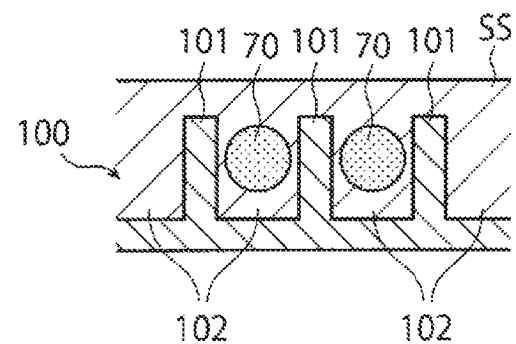
FIG. 6B is a conceptual diagram for explaining a state of a liquid remaining in a sublimable substance film formed on a processing surface of a wafer (a state before heating the sublimable substance film).
Figure 7A:
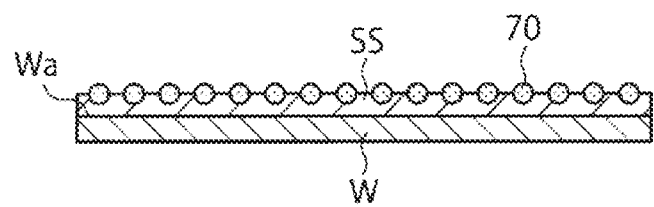
FIG. 7A is a conceptual diagram for explaining a state of a liquid remaining in a sublimable substance film formed on a processing surface of a wafer (a state in which the sublimable substance film is heated but does not reach a sublimation temperature).
Figure 7B:
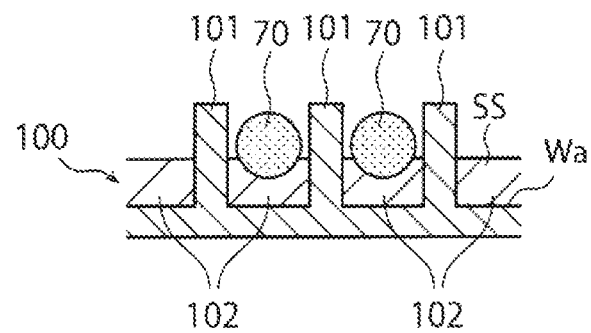
FIG. 7B is a conceptual diagram for explaining a state of a liquid remaining in a sublimable substance film formed on a processing surface of a wafer (a state in which the sublimable substance film is heated but does not reach a sublimation temperature).

FIGS. 6A to 7B are conceptual diagrams for explaining the state of the residual liquid 70 in the sublimable substance film SS formed on the processing surface Wa of the wafer W. FIGS. 6A and 7A show the overall cross sections of the wafer W and the sublimable substance film SS. FIGS. 6B and 7B show enlarged cross sections of the processing surface Wa (especially, the pattern 100) of the wafer W and the sublimable substance film SS. FIGS. 6A and 6B show a state before heating the sublimable substance film SS. On the other hand, FIGS. 7A and 7B show a state in which the sublimable substance film SS is heated, but does not reach the sublimation temperature. For easy understanding, FIGS. 6A to 7B may include portions illustrated in an exaggerated manner or may not correspond exactly to other views. However, those skilled in the art will be able to easily understand the states shown in FIGS. 6A to 7B.

As shown in FIGS. 6A and 6B, the residual liquid 70 in the sublimable substance film SS remains in a state in which it is contained in a solid sublimable substance, and may also exist in the recesses 102 of the pattern 100. The residual liquid 70 may usually contain a processing liquid (chemical liquid, rinsing liquid, etc.) used in the liquid processing performed in advance, and a solvent included in the sublimable substance solution SL. For example, the residual liquid 70 is composed of water and IPA.

Generally, the sublimation temperature of the sublimable substance film SS is much higher than the boiling point of the residual liquid 70. Therefore, it has been considered that, in the process of heating the sublimable substance film SS to sublimate the same, the residual liquid. 70 is vaporized before the sublimable substance film SS reaches the sublimation temperature, and does not induce pattern collapse. However, in reality, as described above, the sublimable substance film SS partially disappears before reaching its sublimation temperature. For that reason, a part of the sublimable substance film SS disappears before the residual liquid 70 is completely vaporized. As shown in FIGS. 7A and 7B, the surface of the sublimable substance film SS is located at a position lower than the top points of the protrusions 101 of the pattern 100. There may be a portion where the residual liquid 70 is exposed from the sublimable substance film SS in the recesses 102 of the pattern 100. The residual liquid 70 exposed from the sublimable substance film SS in this manner is finally evaporated. However, if the residual liquid 70 in the recesses 102 is changed from the liquid state to the gas state and evaporated in a state in which the adjacent protrusions 101 are not covered with the sublimable substance film SS, the pattern collapse due to the surface tension of the residual liquid 70 occurs as in the normal liquid drying.

In order to prevent such pattern collapse caused by the residual liquid 70, the substrate drying apparatus and substrate drying method described below are effective.

As described above, in order to dry the wafer W having the processing surface Wa that has been subjected to the liquid processing using the processing liquid (chemical liquid, rinsing liquid, etc.), the substrate drying method according to the present embodiment includes a first processing step of forming the sublimable substance film SS, which is a solid film of a sublimable substance, on the processing surface Wa, and a second processing step of sublimating the sublimable substance film SS to remove the sublimable substance film SS from the processing surface Wa. The first processing step includes a step of supplying a sublimable substance solution SL containing a sublimable substance and a solvent to the processing surface Wa, and a step of forming a sublimable substance film SS on the processing surface Wa by removing the solvent and the processing liquid from the processing surface Wa to which the sublimable substance solution SL is supplied.

Then, in the second processing step, before the sublimable substance film SS is sublimated and removed from the processing surface Wa, a heat treatment for vaporizing the solvent and the processing liquid remaining in the sublimable substance film SS is performed. That is, in the second processing step, there is performed a step of vaporizing the solvent and the processing liquid remaining in the sublimable substance film SS by heating the wafer W on which the sublimable substance film SS is formed and maintaining the wafer W at a temperature falling within a first temperature range lower than the sublimation temperature of the sublimable substance (pre-vaporization processing step). As a result, the residual liquid 70 contained in the sublimable substance film SS is heated and changed from the liquid state to the gas state. In the present embodiment, the first temperature range is set to a temperature range that indicates a temperature equal to or higher than the boiling points of the solvent or the processing solution remaining on the wafer W (particularly on the pattern 100 (in the recesses 102)), whichever is higher. Therefore, it is possible to simultaneously promote vaporization of both the solvent and the processing liquid contained in the residual liquid 70.

Then, after the pre-vaporization processing step, there is performed a step of removing the sublimable substance film SS from the processing surface Wa by heating the wafer W to a temperature falling within a second temperature range equal to or higher than the sublimation temperature of the sublimable substance (sublimation processing step), In this sublimation processing step, the sublimable substance film SS is sublimated in a state in which the residual liquid 70 has been vaporized by the above-described pre-vaporization processing step. Therefore, it is possible to prevent the liquid state residual liquid 70 from being exposed from the sublimable substance film SS in the recesses 102 and to prevent the pattern collapse due to the surface tension of the residual liquid 70.

Figure 3:
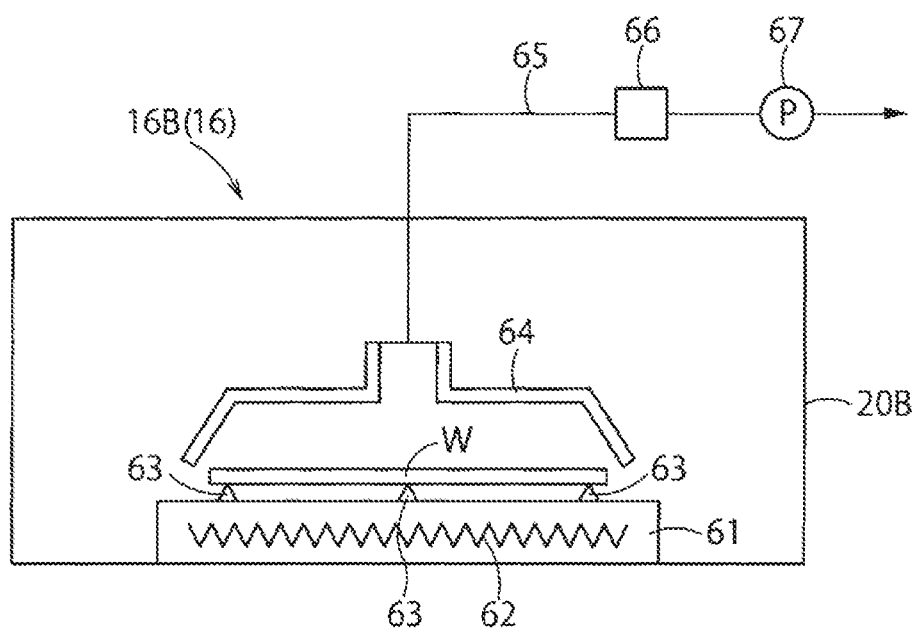
FIG. 3 is a view showing a schematic configuration of a baking unit.

In the substrate processing system 1 (substrate drying apparatus) of the present embodiment, the above-described first processing step is performed by the cleaning unit 16A (first unit) shown FIG. 2, and the above-described second processing step is performed by the baking unit 16B (second unit) shown in FIG. 3. In the cleaning unit 16A, the solution supplier that supplies the sublimable substance solution SL to the processing surface Wa of the wafer W includes the sublimable substance solution nozzle 44 and the nozzle arm 45. The first liquid remover that forms the sublimable substance film SS on the processing surface Wa includes the substrate holding mechanism 30 configured as a rotator that rotates the wafer W. As the control device 4 controls the substrate holding mechanism 30 to rotate the wafer W, a spin drying process for evaporating the liquid (solvent and processing liquid) from the processing surface Wa is performed. On the other hand, in the baking unit 16B, both the second liquid remover that vaporizes the solvent and the processing liquid remaining in the sublimable substance film SS and the solid film remover that removes the sublimable substance film SS from the processing surface Wa are implemented by combining the heating plate 61 having the built-in resistance heater 62 and the support pins 63 capable of adjusting the amount of protrusion from the heating plate 61.

Figure 8A:
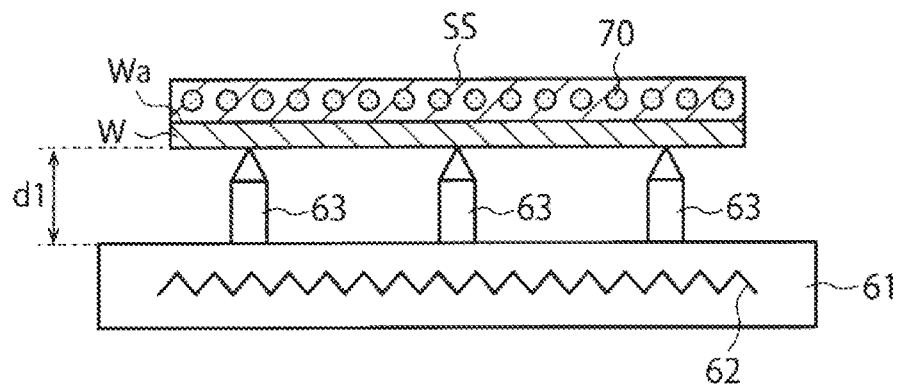
FIG. 8A is a schematic diagram showing a protruding state of support pins.
Figure 8B:
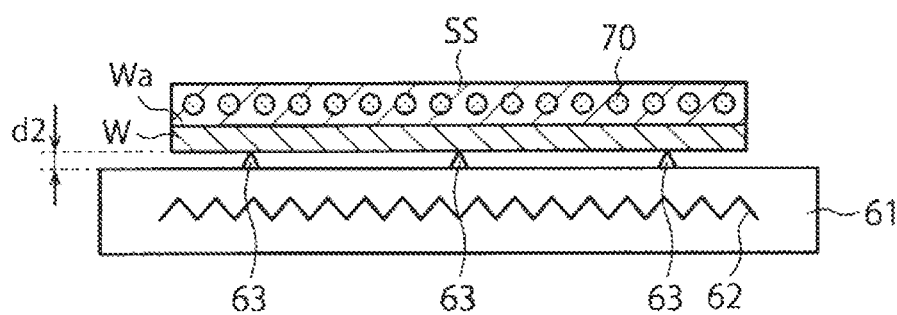
FIG. 8B is a schematic diagram showing a protruding state of support pins.

FIGS. 8A and 8B are schematic diagrams showing the protruding state of the support pins 63. FIG. 8A shows a state in a pre-vaporization processing for vaporizing the solvent and the processing liquid remaining in the sublimable substance film SS. FIG. 8B shows a state in a sublimation process for removing the sublimable substance film SS from the processing surface Wa.

As described above, in the pre-vaporization processing step, the wafer W is heated to and maintained at a temperature falling within the first temperature range lower than the sublimation temperature. In the sublimation processing step, the wafer W is heated to and maintained at a temperature falling within the second temperature range equal to or higher than the sublimation temperature. Therefore, the amount of heat transferred to the wafer W in the pre-vaporization processing step needs to be set smaller than the amount of heat transferred to the wafer W in the sublimation processing step. The heating device provided in the baking unit 16B of the present embodiment can change the amount of heat transferred to the wafer W when heating the water W, and can be used as the second liquid remover and the solid film remover by changing the amount of heat transferred to the wafer W between the pre-vaporization processing step and the sublimation processing step. Specifically, the heating device shown in FIGS. 8A and 8B includes a heating plate 61 and a resistance heater 62 provided as a heater portion, and a plurality of support pins 63 provided as a position adjuster that adjusts the distance between the heater portion and the wafer W. The support pins 63 are provided so that the amount of protrusion from the heater portion (particularly, the heating plate 61) can be changed under the control of the control device 4 (see FIG. 1). The specific number and shape of the support pins 63 are not limited. Furthermore, it is not necessary that the protrusion amounts of all the support pins 63 be changeable. The protrusion amounts of only some of the support pins 63 may be changeable, and the protrusion amounts of the other support pins 63 may be fixed.

For example, in the pre-vaporization processing step using the heating device as the second liquid remover, the protrusion amounts of the support pins 63 are set to be relatively large as shown in FIG. 8A, and the distance between the heater portion (heating plate 61) and the wafer W is a first distance d1. On the other hand, in the sublimation processing step using the heating device as the solid film remover, the protrusion amounts of the support pins 63 are set to be relatively small as shown in FIG. 8B, and the distance between the heater portion (heating plate 61) and the wafer W is a second distance d2. Thus, the distance (first distance d1) between the heater portion (heating plate 61) and the wafer W in the pre-vaporization processing step is larger than the distance (second distance d2) between the heater portion (heating plate 61) and the wafer W in the sublimation processing step (d1>d2).

According to the present embodiment that uses the radiant heat from the heater part as described above, the amount of heat transferred to the wafer W can be easily changed depending on the distance between the heater portion and the wafer W, and each of the pre-vaporization processing step and the sublimation processing step can be appropriately performed by heating the wafer W in a desired temperature range. In particular, since the wafer W is heated from below by the heater portion provided below the wafer W, it is possible to effectively heat and vaporize the residual liquid 70 contained in the sublimable substance film SS. That is, when forming the sublimable substance film SS in the cleaning unit 16A, the liquid (solvent and processing liquid) is evaporated from the sublimable substance solution SL by a spin drying process. This is effective for the vaporization (surface vaporization) of the liquid in the vicinity of the exposed surface of the sublimable substance solution SL, but is not always effective for the vaporization of the liquid existing on the inner side spaced apart from the exposed surface of the sublimable substance solution SL. On the other hand, by heating the sublimable substance film SS through the water W (especially, by heating the sublimable substance film SS from below), it is possible to effectively heat the residual liquid 70 existing on the inner side spaced apart from the exposed surface of the sublimable substance solution SL and to efficiently promote the vaporization (self-evaporation) of the residual liquid 70.

As described above, according to the present embodiment, the process of vaporizing the residual liquid 70 in the sublimable substance film SS is performed before the sublimation phenomenon of the sublimable substance film SS on the processing surface Wa (especially, the pattern 100) of the wafer W proceeds. This makes it possible to effectively prevent the pattern collapse caused by the residual liquid 70.

In particular, by using the heater portion (heating plate 61 and resistance heater 62) and the position adjuster (support pins 63) in combination as the heating device, even when the heating temperature from the heater portion (resistance heater 62) is set constant in one unit, the heating temperature of the wafer W can be easily switched. As described above, according to the apparatus and the method of the present embodiment, the heating vaporization process of the residual liquid 70 (pre-vaporization processing step) and the heating sublimation process of the sublimable substance film SS (sublimation processing step) can be appropriately performed at desired timings, and the configuration and control of the apparatus can be simplified.

First Modification Example

The apparatus of this modification example has the same configuration as that of the apparatus of the above-described embodiment. In the above-described embodiment, the water W is heated to a temperature falling within a single temperature range (i.e., within the first temperature range) in the pre-vaporization processing step. However, in the pre-vaporization processing step of this modification example, the wafer W is gradually heated to temperatures falling within a plurality of temperature ranges.

That is, the pre-vaporization processing step of this modification example includes a first sub-vaporization processing step and a second sub-vaporization processing step performed after the first sub-vaporization processing step. In the first sub-vaporization processing step, the heating device (the heating plate 61, the resistance heater 62 and the support pins 63 (the second liquid removing section)) heats the wafer W on which the sublimable substance film SS is formed, and maintains the wafer W at a temperature falling within a first sub-temperature range of the aforementioned first temperature range for a first sub-temperature time. On the other hand, in the second sub-vaporization processing step, the heating device maintains the wafer W, on which the sublimable substance film SS is formed, at a temperature falling within a second sub-temperature range of the first temperature range for a second sub-temperature time. In this regard, the first sub-temperature range is set to a temperature range equal to or higher than one of the boiling point of the solvent of the sublimable substance solution SL and the boiling point of the processing liquid, whichever is lower (e.g., the boiling point of the solvent), and lower than the other one of the boiling points (e.g., the boiling point of the processing liquid). On the other hand, the second sub-temperature range is set to a temperature range equal to or higher than the other one of the boiling points. Therefore, as a whole, the first sub-temperature range is a lower temperature range than the second sub-temperature range. By performing the pre-vaporization processing step stepwise as described above, it is possible in the first sub-vaporization processing step to mainly promote the vaporization of the solvent or the processing liquid, whichever has a lower boiling point, and it is possible in the second sub-vaporization processing step to promote the vaporization of the solvent or the processing liquid, whichever has a higher boiling point.

By configuring the pre-vaporization processing step of a plurality of steps (first sub-vaporization processing step and second sub-vaporization processing step) having different heating temperatures in this way, it is possible to shorten the second sub-temperature time for which the sublimable substance film SS is heated to a higher temperature, and to effectively suppress the disappearance of the sublimable substance film SS. As shown in FIG. 5, as a result of the verification conducted by the present inventor, it is considered that the degree of disappearance of the sublimable substance film SS at a temperature lower than the sublimation temperature has a correlation with the heating temperature of the sublimable substance film SS, and the degree of disappearance of the sublimable substance film SS tends to increase as the sublimable substance film SS is heated to a higher temperature. Therefore, from the viewpoint of suppressing the degree of disappearance of the sublimable substance film SS, it is preferable that the time for maintaining the sublimable substance film SS at a higher temperature is shorter. Accordingly, from the viewpoint of suppressing the disappearance of the sublimable substance film SS, it is preferable that the second sub-temperature time (i.e., the time for maintaining the wafer W at the temperature falling within the second sub-temperature range) is shorter than the first sub-temperature time (i.e., the time for maintaining the wafer W at the temperature falling within the first sub-temperature range).

Also in this modification example, as in the above-described embodiment, the heating temperature of the wafer W can be adjusted by adjusting the distance between the heater portion (heating plate 61) and the wafer W. Therefore, when the distance between the heater portion (heating plate 61) and the wafer W in the first sub-vaporization processing step is represented by "d3" (not shown) and the distance between the heater portion (heating plate 61) and the wafer W in the second drying step is represented by "d4" (not shown), the distances d3 and d4 and the distance d2 between the heater portion (heating plate 61) and the wafer W in the sublimation processing step described above have the relationship of "d2<d4<d3".

Other Modification Examples

The amount of heat transferred from the heater portion (heating plate 61 and resistance heater 62) to the wafer W may be adjusted by a method other than the method of adjusting the distance between the heater portion (heating plate 61) and the wafer W. For example, a method of adjusting the amount of heat generation (e.g., the amount of power supply) of the heater portion (resistance heater 62) under the control of the control device 4 may be adopted. In addition, a plurality of heater portions may be installed in the baking unit 16B, and the number of heater portions that actually generate heat may be adjusted under the control of the control device 4 to adjust the amount of heat transferred to the wafer W. Moreover, two or more of these methods and other methods may be combined.

Furthermore, the exhaust amount through the exhaust pipe 65 (see FIG. 3) may be changed between the pre-vaporization processing step and the sublimation processing step, or may be changed between the first sub-vaporization processing step and the second sub-vaporization processing step. For example, the control device 4 (see FIG. 1) may control the pump 67 (see FIG. 3) so that the exhaust amount in the sublimation processing step becomes larger than the exhaust amount in the pre-vaporization processing step. Furthermore, in each step, the control device 4 may control the pump 67 so that the humidity in the chamber 20B (especially, the space above the wafer W) becomes a desired humidity and the solvent concentration detected by the solvent concentration sensor 46 becomes a desired concentration.

Furthermore, the application target of the present disclosure is not limited to the apparatus and the method. For example, the present disclosure may be embodied as a storage medium (non-transitory computer-readable recording medium) storing a program that, when executed by a computer for controlling the operation of the substrate drying apparatus described above, causes the computer to control the substrate drying apparatus to execute the substrate drying method.

Specific Examples of Sublimable Substances and the Like

The sublimable substance that can be used in the above-described apparatus and method is not particularly limited, and may be, for example, ammonium silicofluoride ($(NH_4)_2SiF_6$), camphor, naphthalene or the like. When ammonium silicofluoride ($(NH_4)_2SiF_6$) is used as the sublimable substance, pure water (DIW), a mixed liquid of DIW and isopropyl alcohol (IPA), or the like may be used as the solvent. When camphor or naphthalene is used as the sublimable substance, alcohols (such as IPA and the like) may be used as the solvent. The sublimable substance is not limited to the above examples, and may be any substance that can maintain a solid state before the start of the heat treatment.

Instead of or together with the above sublimable substance, sublimable substances represented by the following formulae (Ia), (Ib), (Ic), (Id), (IIa), (IIb), (IIc), (IId), (IIe), (IIIa), (IIIb), (IVa) and (IVb) may be used (see JP-A-2005-106645). These sublimable substances are organic substances having a vapor pressure of 5 Pa or less at the room temperature and exhibit sublimability under a reduced pressure and/or a heating condition.

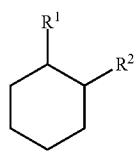

(Ia)

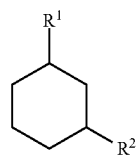

(Ib)

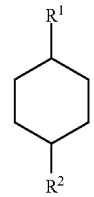

(Ic)

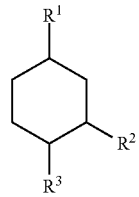

(Id)

In formulae (Ia), (Ib), (Ic) and (Id), $R^1$, $R^2$ and $R^3$ independently denote a hydroxyl group (—OH), a carboxyl group (—COOH), an amino group (—NH$_2$), an amide group (—CONH$_2$), a nitro group (—NO$_2$), or a methyl ester group (—COO—CH$_3$).

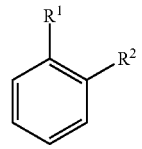

(IIa)

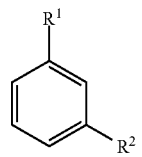

(IIb)

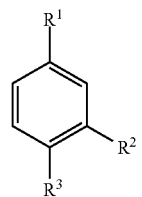

(IIc)

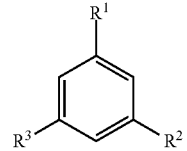

(IId)

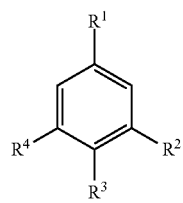
(IIe)

In formulae (IIa), (IIb), (IIc), (IId) and (IIe), $R^1$, $R^2$, $R^3$ and $R^4$ independently denote a hydroxyl group (—OH), a carboxy group (—COOH), an amino group (—NH$_2$), an amide group (—CONH$_2$), a nitro group (—NO$_2$), a methyl ester group (—COO—CH$_3$), a methoxy group (—OCH$_3$), ethoxy group (—OCH$_2$CH$_3$), or a propoxy group (—OCH$_2$CH$_2$CH$_3$).

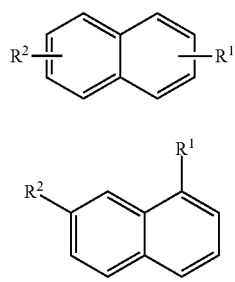
(IIIa)
(IIIb)

In formulae (IIIa) and (IIIb), $R^1$ and $R^2$ independently denote a hydroxy group (—OH), a carboxyl group (—COOH), an amino group (—NH$_2$), an amide group (—CONH$_2$), a nitro group (—NO$_2$), a methyl ester group (—COO—CH$_3$), a methoxy group (—OCH$_3$), an ethoxy group (—OCH$_2$CH$_3$), or a propoxy group (—OCH$_2$CH$_2$CH$_3$).

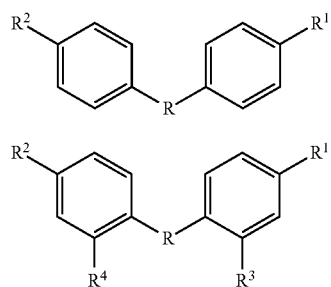
(IVa)
(IVb)

In formulae (IVa) and (IVb), $R^1$, $R^2$, $R^3$ and $R^4$ independently denote a hydroxy group (—OH), a carboxyl group (—COOH), an amino group (—NH$_2$), an amide group (—CONH$_2$), a nitro group (—NO$_2$), a methyl ester group (—COO—CH$_3$), a methoxy group (—OCH$_3$), an ethoxy group (—OCH$_2$CH$_3$), or a propoxy group (—OCH$_2$CH$_2$CH$_3$). R denotes a carbonyl group (—CO—), a peptide bond (—CONH—), an ester bond (—COO—), an ether bond (—O—), a (—NHNHO—) bond, a (—COCOO—) bond, or a (—CHCH—) bond.

Examples of the sublimable substance represented by formulae (Ia) to (Id) include cyclohexane-1,2-dicarboxylic acid, cyclohexane-1,3-dicarboxylic acid, cyclohexane-1,4-dicarboxylic acid, cyclohexane-1,2,4-tricarboxylic acid, and the like.

Examples of the sublimable substance represented by formula (IIa) or (IIb) include phthalic acid, aminoacetophenone, and the like.

Examples of the sublimable substance represented by formula (IIc) include vanillin, 4-hydroxyphthalic acid, trimellitic acid, trimellitic anhydride, dimethoxyacetophenone, and the like.

Examples of the sublimable substance represented by formula (IId) include 5-hydroxyisophthalic acid, and the like.

Examples of the sublimable substance represented by formula (IIe) include gallic acid, methyl gallate, and the like.

Examples of the sublimable substance represented by formula (IIIa) or (Mb) include 1,7-dihydronaphthalene, and the like.

Examples of the sublimable substance represented by formula (IIIa) or (IVb) include 4,4'-dihydroxybenzophenone, 4,4'-tetrahydroxybenzophenone, and the like.

The sublimable substance solution contains impurities in addition to the sublimable substance and the solvent. The impurities are, for example, substances mixed in the sublimable substance at the time of producing the sublimable substance, substances mixed in the solvent at the time of producing the solvent, and the like. Specific examples of the impurities include organic impurities (e.g., hexamethylcyclotrisiloxane, methylamine, 1-bromooctadecane), polymers having a fluorine atom (e.g., polyvinylidene fluoride), and the like. Since the sublimable substance and/or the solvent used as the raw material of the sublimable substance solution contains impurities, the sublimable substance solution contain impurities in addition to the sublimable substance and the solvent.

Examples of the chemical liquid include DHF, BHF, SC-1, SC-2, APM, SPM, and the like.

EXPLANATION OF REFERENCE NUMERALS

16: processing unit, 16A: cleaning unit. 16B: baking unit, 30: substrate holding mechanism, 44: sublimable substance solution nozzle, 45: nozzle arm, 61: heating plate, 62: resistance heater, 63: support pin, 70: residual liquid, SL: sublimable substance solution, SS: sublimable substance film, W: wafer, Wa: processing surface.

What is claimed is:

1. A substrate drying apparatus for drying a substrate having a processing surface that has been subjected to a liquid processing using a processing liquid, the apparatus comprising:
   a first unit configured to form a solid film of a sublimable substance on the processing surface; and
   a second unit configured to remove the solid film from the processing surface by sublimating the solid film,
   wherein the first unit includes:
   a solution supplier configured to supply a sublimable substance solution containing the sublimable substance and a solvent to the processing surface; and
   a first liquid remover configured to remove the solvent and the processing liquid from the processing surface supplied with the sublimable substance solution and to form the solid film of the sublimable substance on the processing surface, and wherein the second unit includes:

a second liquid remover configured to vaporize the solvent and the processing liquid remaining in the solid film by heating the substrate, on which the solid film is formed, and maintaining the substrate at a temperature falling within a first temperature range that is lower than a sublimation temperature of the sublimable substance; and a solid film remover configured to remove the solid film from the processing surface by heating the substrate to a temperature falling within a second temperature range that is equal to or higher than the sublimation temperature of the sublimable substance after the second liquid remover maintains the substrate at the temperature falling within the first temperature range.

2. The apparatus of claim 1, wherein the second liquid remover is further configured to heat the substrate from below.

3. The apparatus of claim 2, wherein the first liquid remover includes a rotator configured to rotate the substrate, and the first liquid remover is further configured to evaporate the solvent and the processing liquid from the processing surface by rotating the substrate through the rotator.

4. The apparatus of claim 2, wherein the second unit includes a heating device configured to heat the substrate and capable of changing an amount of heat transferred to the substrate, and wherein the heating device is used as both the second liquid remover and the solid film remover by changing the amount of heat transferred to the substrate.

5. The apparatus of claim 1, wherein the first liquid remover includes a rotator configured to rotate the substrate, and the first liquid remover is further configured to evaporate the solvent and the processing liquid from the processing surface by rotating the substrate through the rotator.

6. The apparatus of claim 5, wherein the second unit includes a heating device configured to heat the substrate and capable of changing an amount of heat transferred to the substrate, and wherein the heating device is used as both the second liquid remover and the solid film remover by changing the amount of heat transferred to the substrate.

7. The apparatus of claim 5, wherein the first temperature range is a temperature range that is equal to or higher than a boiling point of the solvent or a boiling point of the processing liquid, whichever is higher.

8. The apparatus of claim 1, wherein the second unit includes a heating device configured to heat the substrate and capable of changing an amount of heat transferred to the substrate, and wherein the heating device is used as both the second liquid remover and the solid film remover by changing the amount of heat transferred to the substrate.

9. The apparatus of claim 8, wherein the heating device includes a heater portion and a position adjuster configured to adjust a distance between the heater portion and the substrate, and wherein the distance between the heater portion and the substrate when the heating device is used as the second liquid remover is larger than the distance between the heater portion and the substrate when the heating device is used as the solid film remover.

10. The apparatus of claim 8, wherein the first temperature range is a temperature range that is equal to or higher than a boiling point of the solvent or a boiling point of the processing liquid, whichever is higher.

11. The apparatus of claim 1, wherein the first temperature range is a temperature range that is equal to or higher than a boiling point of the solvent or a boiling point of the processing liquid, whichever is higher.

12. The apparatus of claim 1, wherein the second liquid remover is further configured to heat the substrate, on which the solid film is formed, and to maintain the substrate at a temperature falling within a first sub-temperature range within the first temperature range for a first sub-temperature time, and is further configured to maintain the substrate at a temperature falling within a second sub-temperature range within the first temperature range for a second sub-temperature time, after the substrate, on which the solid film is formed, is maintained at the temperature falling within the first sub-temperature range for the first sub-temperature time, wherein the first sub-temperature range is a temperature range equal to or higher than one of a boiling point of the solvent and a boiling point of the processing liquid, whichever is lower, and lower than the other one of the boiling points, and wherein the second sub-temperature range is a temperature range equal to or higher than the other one of the boiling points.

13. The apparatus of claim 12, wherein the second sub-temperature time is shorter than the first sub-temperature time.

14. A substrate drying method for drying a substrate having a processing surface that has been subjected to a liquid processing using a processing liquid, comprising:

a first processing step of forming a solid film of a sublimable substance on the processing surface; and a second processing step of removing the solid film from the processing surface by sublimating the solid film, wherein the first processing step includes:

supplying a sublimable substance solution containing the sublimable substance and a solvent to the processing surface; and removing the solvent and the processing liquid from the processing surface supplied with the sublimable substance solution and forming the solid film of the sublimable substance on the processing surface, and wherein the second processing step includes:

vaporizing the solvent and the processing liquid remaining in the solid film by heating the substrate, on which the solid film is formed, and maintaining the substrate at a temperature falling within a first temperature range that is lower than a sublimation temperature of the sublimable substance; and removing the solid film from the processing surface by heating the substrate to a temperature falling within a second temperature range that is equal to or higher than the sublimation temperature of the sublimable substance after the substrate is maintained at the temperature falling within the first temperature range.

15. A storage medium storing a program that, when executed by a computer for controlling an operation of a substrate drying apparatus, causes the computer to control the substrate drying apparatus to perform the substrate drying method of claim 14.

* * * * *